United States Patent
Thompson

(10) Patent No.: US 12,287,151 B2
(45) Date of Patent: Apr. 29, 2025

(54) THERMAL PLATE HAVING A FLUID CHANNEL

(71) Applicant: Teradyne, Inc., North Reading, MA (US)

(72) Inventor: Jack Michael Thompson, Agoura Hills, CA (US)

(73) Assignee: Teradyne, Inc., North Reading, MA (US)

( * ) Notice: Subject to any disclaimer, the term of this patent is extended or adjusted under 35 U.S.C. 154(b) by 484 days.

(21) Appl. No.: 17/186,145

(22) Filed: Feb. 26, 2021

(65) Prior Publication Data

US 2022/0276008 A1    Sep. 1, 2022

(51) Int. Cl.
- F28D 1/047 (2006.01)
- F24F 11/30 (2018.01)
- F24F 11/74 (2018.01)
- F24F 11/76 (2018.01)

(52) U.S. Cl.
CPC ............ *F28D 1/0477* (2013.01); *F24F 11/30* (2018.01); *F24F 11/74* (2018.01); *F24F 11/76* (2018.01); *F28F 2210/02* (2013.01); *F28F 2210/10* (2013.01)

(58) Field of Classification Search
CPC ......... F28D 1/0477; F24F 11/74; F24F 11/76; F24F 11/30; F28F 2210/02; F28F 2210/10
USPC ........................................................ 165/247
See application file for complete search history.

(56) References Cited

U.S. PATENT DOCUMENTS

| | | | |
|---|---|---|---|
| 1,329,559 A | 2/1920 | Tesla | |
| 2,626,130 A * | 1/1953 | Raskin | B21D 53/04 165/169 |
| 2,957,679 A * | 10/1960 | Campbell | F28D 1/0358 165/DIG. 485 |
| 4,066,121 A * | 1/1978 | Kleine | B23P 15/26 165/170 |
| 4,165,733 A * | 8/1979 | Middleton | F24S 10/504 126/588 |

(Continued)

FOREIGN PATENT DOCUMENTS

| | | |
|---|---|---|
| CN | 205071574 U | 3/2016 |
| CN | 107255425 B | 5/2020 |

(Continued)

OTHER PUBLICATIONS

Written Opinion for International application No. PCT/US2022/017706, Issued Jun. 13, 2022, (4 pages).

(Continued)

*Primary Examiner* — Claire E Rojohn, III
(74) *Attorney, Agent, or Firm* — ArentFox Schiff LLP

(57) ABSTRACT

An example apparatus is for contacting a device to change a temperature of the device. The apparatus includes a plate configured to contact the device and a channel within the plate configured to enable flow of fluid between an input port and an output port. The plate includes a thermally conductive material to conduct heat between the device and the fluid. The channel includes multiple islands arranged in series. An island among the multiple islands is arranged to receive the fluid at a first side. The island is for splitting the fluid into a first flow and a second flow and for causing the first flow and the second flow to merge at a second side of the island that is downstream of the first side of the island.

16 Claims, 5 Drawing Sheets

(56) References Cited

U.S. PATENT DOCUMENTS

| | | | | |
|---|---|---|---|---|
| 4,227,391 A * | 10/1980 | Belangee | F24S 10/506 | 29/890.04 |
| 4,303,060 A * | 12/1981 | Mart | F24S 10/506 | 165/170 |
| 5,265,636 A * | 11/1993 | Reed | F15C 1/146 | 137/833 |
| 5,439,050 A * | 8/1995 | Waterman | F24H 8/00 | 165/170 |
| 6,989,134 B2 * | 1/2006 | Tonkovich | B23K 31/02 | 165/167 |
| 7,187,549 B2 | 3/2007 | Teneketges et al. | | |
| 8,037,927 B2 * | 10/2011 | Schuette | F28F 3/06 | 165/80.4 |
| 8,528,628 B2 * | 9/2013 | Robinson | F28F 3/12 | 165/104.31 |
| 8,736,288 B2 * | 5/2014 | Lewinnek | G01R 31/2877 | 324/750.08 |
| 9,829,804 B1 * | 11/2017 | Scheffers | G03F 7/70875 | |
| 9,903,536 B2 * | 2/2018 | Lin | F15B 13/027 | |
| 9,915,362 B2 * | 3/2018 | Hampton | F16K 99/0057 | |
| 10,935,330 B2 | 3/2021 | Subramanyam et al. | | |
| 2007/0159797 A1 * | 7/2007 | Teneketges | H01L 23/473 | 257/E23.098 |
| 2008/0136439 A1 | 6/2008 | Adam et al. | | |
| 2009/0114372 A1 * | 5/2009 | Ippoushi | F28F 3/12 | 165/104.19 |
| 2009/0285956 A1 * | 11/2009 | Landers | F28F 3/046 | 426/477 |
| 2012/0291999 A1 * | 11/2012 | Lewinnek | G01R 31/2877 | 165/104.31 |
| 2013/0206374 A1 * | 8/2013 | Roisin | F28D 7/0041 | 165/165 |
| 2015/0059718 A1 * | 3/2015 | Claywell | F01M 13/04 | 123/572 |
| 2015/0260464 A1 * | 9/2015 | Cole | F28F 9/26 | 165/185 |
| 2016/0023127 A1 * | 1/2016 | Park | B01D 5/009 | 165/113 |
| 2018/0326419 A1 * | 11/2018 | Yu | B01L 3/502761 | |
| 2020/0072565 A1 * | 3/2020 | Klaba | F28D 1/035 | |
| 2020/0182551 A1 * | 6/2020 | Suzuki | F28F 3/08 | |
| 2020/0300488 A1 * | 9/2020 | Subramanyam | F28F 3/08 | |
| 2021/0095927 A1 * | 4/2021 | Yang | F28F 9/0275 | |
| 2021/0148639 A1 * | 5/2021 | Graves | H01M 10/6556 | |
| 2022/0276008 A1 * | 9/2022 | Thompson | H01L 23/473 | |
| 2022/0412662 A1 * | 12/2022 | Salamon | H01S 5/02476 | |

FOREIGN PATENT DOCUMENTS

| | | |
|---|---|---|
| CN | 111200137 B | 8/2021 |
| EP | 3751849 A1 | 12/2020 |
| KR | 10-1945964 B1 | 2/2019 |
| WO | 2013171216 A1 | 11/2013 |

OTHER PUBLICATIONS

International Search Report for International application No. PCT/US2022/017706, issued Jun. 13, 2022, (3 pages).

International Preliminary Report on Patentability in Application No. PCT/US2022/017706, dated Aug. 29, 2023, 6 pages.

International Preliminary Report on Patentability received for PCT Patent Application No. PCT/US2022/017706, mailed on Jun. 13, 2022, 5 pages.

* cited by examiner

THERMAL PLATE HAVING A FLUID CHANNEL

TECHNICAL FIELD

This specification is directed to a thermal plate having a fluid channel configured to change fluid flow pressure.

BACKGROUND

Electronics generate heat during operation. That heat may cause damage or have other adverse effects. A thermal plate may be used to cool the electronics by transferring heat from the electronics to the plate.

SUMMARY

An example apparatus is for contacting a device to change a temperature of the device. The apparatus includes a plate configured to contact the device and a channel within the plate configured to enable flow of fluid between an input port and an output port. The plate includes a thermally conductive material to conduct heat between the device and the fluid. The channel includes multiple islands arranged in series. An island among the multiple islands is arranged to receive the fluid at a first side. The island is for splitting the fluid into a first flow and a second flow and for causing the first flow and the second flow to merge at a second side of the island that is downstream of the first side of the island. The example apparatus may include one or more of the following features, either alone or in combination.

The second side of the island may be configured to bend each of the first flow and the second flow past 90° towards a center of the second side. The second side of the island may be configured to cause the first flow and the second flow to collide downstream of the first side of the island. The second side of the island may be configured to cause the first flow and the second flow to collide at or near a center of the second side. The second side of the island may have a shape that is at least partly concave. The second side of the island may have a shape that is at least partly and symmetrically curved inward towards the first side.

Each of the multiple islands may be arranged to receive the fluid at a first side, may be configured to split the flow of fluid into separate fluid flows, and may be configured to cause the separate fluid flows to merge downstream. Each of the multiple islands may be configured to bend each of the separate flows past 90° towards an island center. The multiple islands may be configured to reduce energy of the fluid flow through the channel. The multiple islands may be configured to reduce energy of the fluid flow through the channel without increasing velocity of the fluid flow through the channel. The channel may include sets of the multiple islands at points along the channel. Each set of the multiple islands may be separated on the channel by a non-island feature. The sets of multiple islands may be arranged in the channel to distribute fluid pressure drops across different parts of the plate.

The second side of the island may be configured to cause the first fluid flow and the second fluid flow to collide downstream of the first side of the island and to thereby merge for downstream movement to a second island among the multiple islands. The island may have a shape that approximates a shape of a kidney. The island may have a shape that approximates a shape of a jelly bean.

The apparatus may include a quick disconnect assembly that includes the input port to receive the fluid and the output port to move the fluid off of the plate. The device may include a circuit board. The fluid may include a coolant to draw heat from the circuit board. The fluid may include heated liquid to increase a temperature of the device. The apparatus may include a thermally-conductive substance between the plate and the device.

An example system includes a test instrument including a thermal plate configured to change a temperature of a device under test by flow of fluid through the thermal plate, and a control system configured to control operation of the test instrument including the flow of fluid through the thermal plate. The thermal plate may include a channel within the thermal plate configured to enable the flow of fluid between an input port and an output port. The thermal plate may include a thermally conductive material to conduct heat between the device under test and the fluid. The channel may include multiple islands arranged in series. An island among the multiple islands may be arranged to receive the fluid at a first side. The island may be for splitting the fluid into a first flow and a second flow and for causing the first flow and the second flow to merge at a second side of the island that is downstream of the first side of the island. The example system may include one or more of the following features, either alone or in combination.

The second side of the island may be configured to bend each of the first flow and the second flow past 90° towards a center of the second side. The second side of the island may be configured to cause the first flow and the second flow to collide downstream of the first side of the island. The device under test may include a circuit board. The fluid may include a liquid or gaseous coolant to draw heat from the circuit board. The test instrument may include a radio frequency test instrument.

The channel may include sets of the multiple islands at points along the channel. Each set of the multiple islands may be separated on the channel by a non-island feature. The sets of multiple islands may be arranged in the channel to distribute fluid pressure drops across different parts of the plate.

Each island may have a shape that approximates a shape of a kidney. Each island may have a shape that approximates a shape of a jelly bean.

Two or more of the features described in this specification, including in this summary section, may be combined to form implementations not specifically described in this specification.

At least part of the systems and techniques described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the systems and techniques described in this specification may be configured or controlled using a computing system comprised of one or more processing devices and memory storing instructions that are executable by the one or more processing devices to perform various control operations. The systems and techniques, components, and variations thereof described herein may be configured, for example through design, construction, arrangement, placement, programming, operation, activation, deactivation, and/or control.

The details of one or more implementations are set forth in the accompanying drawings and the description below. Other features and advantages will be apparent from the description and drawings, and from the claims.

DESCRIPTION OF THE DRAWINGS

Like reference numerals in different figures indicate like elements.

DETAILED DESCRIPTION

Figure 1:
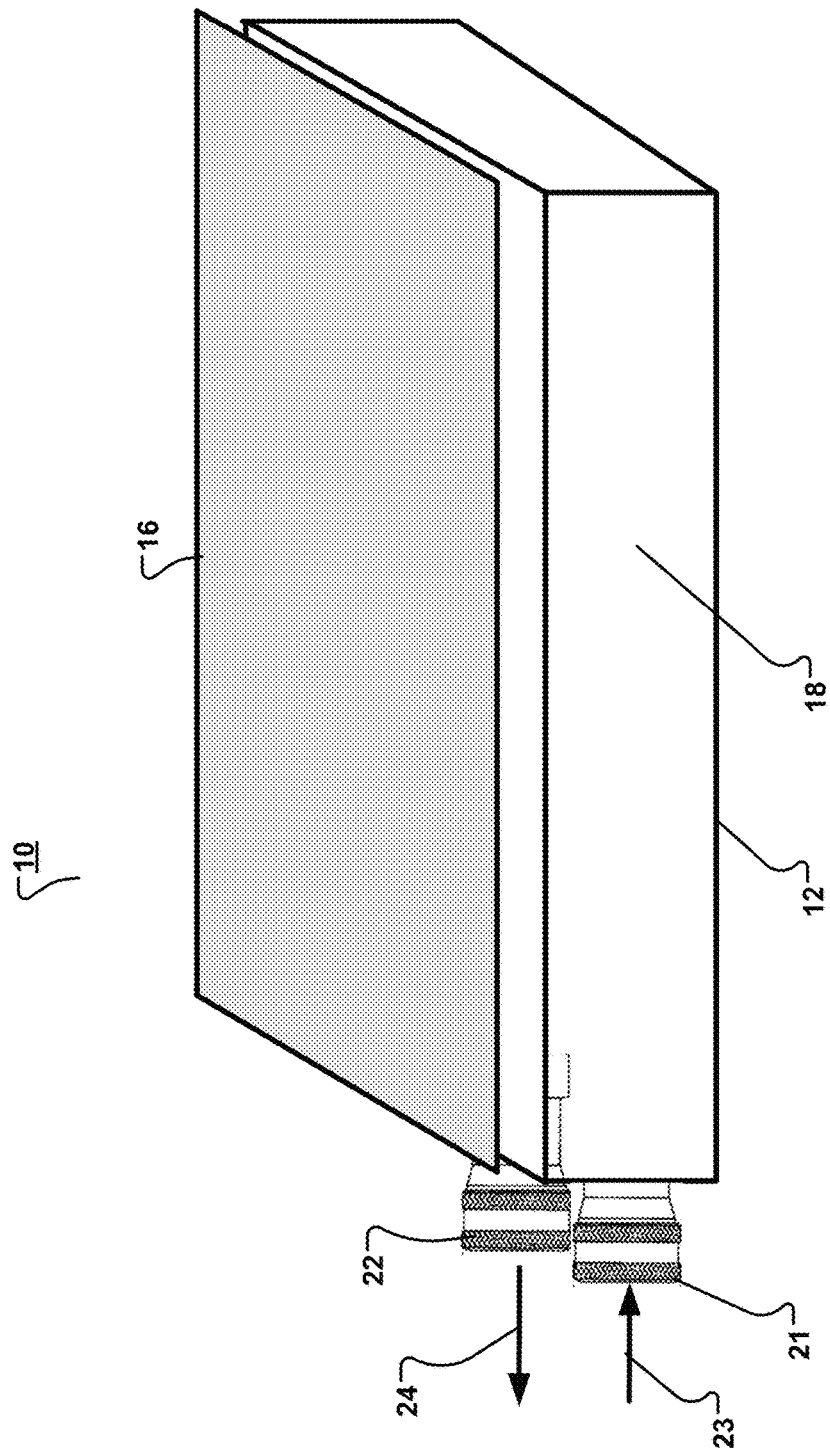
FIG. 1 is a perspective view of an example thermally-conductive plate in contact with a printed circuit board (PCB).

Fluid flow through a structure, such as a thermally-conductive plate (referred to as a "plate"), may be used to control the temperature of electronics, such as a printed circuit board (PCB) and electronic devices thereon. For example, chilled water or a cryogenic liquid may be forced through one or more channels on the plate. The fluid draws heat from the electronics and, as a result, the fluid increases in temperature. As the fluid flows through restrictive features inside the plate, the local velocity increases. As the velocity increases, the local pressure drops. If this local pressure drops below the fluid's vapor pressure, the fluid changes phase from liquid to gas, causing vapor bubbles to be formed. As the fluid moves beyond the restrictive feature, the fluid velocity drops back down and the local pressure goes back up. As this local pressure rises back above the fluid's vapor pressure, the bubbles then collapse instantaneously as the fluid changes back from gas to liquid phase. The collapse of each bubble causes shock waves, which creates noise and vibration in the plate. The noise and vibrations can transferred to the electronics on the PCB and cause damage to, or affect performance, of the electronics.

Described herein are example systems for controlling the temperature of electronics. For illustration, the systems are described in the context of controlling the temperature of a PCB having electronic devices mounted thereon. This structure—a PCB having electronic devices mounted thereon—is referred to as a "device board". However, the plates and associated features described herein are not limited to controlling the temperatures of device boards or other PCBs. Rather, the plates and their associated features may be used in any appropriate context to control the temperature of a structure through physical contact with the structure.

Example implementations include an apparatus configured to change and/or to control a temperature of a device board during before, during, or after its operation. The apparatus includes a plate configured to contact the device board and a channel within the plate configured to enable flow of fluid between an input port and an output port thereon. The channel includes a passage, duct, or conduit for enabling the flow of fluid through at least part of the plate. The plate is made of a thermally-conductive material that conducts heat between the device board and the fluid. The channel includes multiple islands arranged in series. Individual islands are configured and arranged to receive the fluid at a first side, to split the fluid into a first and second flows, and to cause the first and second flows to merge at a second side of the island that is downstream of the first side of the island. For example, the first flow and the second flow may collide at the second side of the island. This merging or colliding of the first flow and the second flow reduces the energy of the fluid flow (referred to as a "flow"), and may make the fluid in the channel less susceptible to cavitation and its attendant consequences.

FIG. 1 shows an example implementation of system 10 that that uses a plate 12 such as that described above to change a temperature of—for example, to cool—a device board 16. In this example, system 10 is part of a test system, such as automatic test equipment (ATE) described below. However, plate 12 may be used outside the context of ATE and outside the context of testing in general.

As shown in FIG. 1, plate 12 configured to contact device board 16 and is configured to change a temperature of device board 16, including the temperature of the PCB and the electronic devices (not shown) thereon. In some implementations, there may be a conductive gel or other thermally-conductive substance between the plate and the device board to support heat transfer. In an example, plate 12 may be maintained at a temperature below that of device board 16 and may cool device board 16 through conduction; that is, draw heat from device board 16 into plate 12 and the fluid in its channels. This sort of conductive cooling or, more generally, thermal control, may occur before, during, and/or after testing performed on the device board or other electronic devices. In this regard, as explained below, in some implementations, plate 12 may be maintained at a temperature that is above that of device board 16 and may heat the device board through conduction; that is, device board 16 may draw heat from plate 12 into device board 16.

Plate 16 may be mechanically connectable to device board 16 or simply may be configured to contact the device board without connection. Plate 16 may have any appropriate geometric shape. For example, plate 16 may be rectangular, square, triangular, circular, or hexagonal. In the example of FIG. 1, plate 16 is flat and has a rectangular shape. Plate 16 includes top and bottom surfaces and sidewalls that enclose an internal volume 18. This internal volume houses material, such as coolant, for controlling temperature through thermal conduction.

Figure 2:
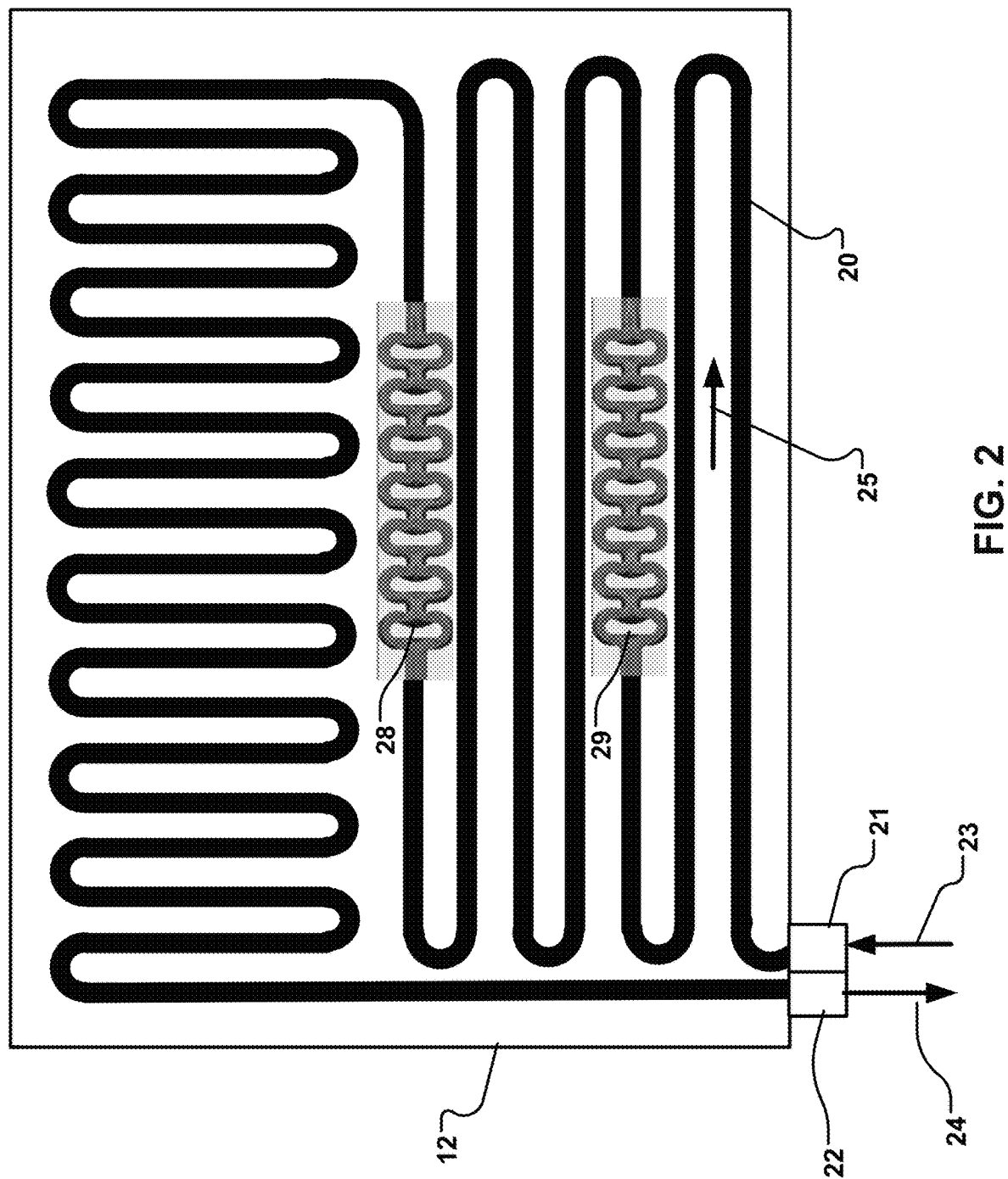
FIG. 2 is a cut-away front view of an example fluid channel that may be included in the thermally-conductive plate of FIG. 1.

In the example of FIG. 1, plate 12 includes one or more fluid flow channels (or simply, "channels") within its internal volume 18. An example channel 20 within plate 12 is shown in FIG. 2. Although only one channel 20 is shown in FIG. 2, more than one channel may be included on a single plate such as plate 12. For example, multiple channels may be included at the same or different depths within the plate. Channel 20 may have any appropriate configuration and is not limited to the configuration shown in FIG. 2. For example, a channel may include a different set of curves or lengths of conduits than that shown and may run three-dimensionally within the plate—for example, the channel run horizontally (Cartesian x dimension), vertically (Cartesian y dimension), and depth-wise (Cartesian z dimension).

In this example, channel 20 is configured to spread coolant throughout plate 12, including in its center and edge regions. Channel 20 includes a single fluid flow path in this example, from an input 21 through plate 12, to an output 22. For example, referring also to FIG. 1, fluid (represented by arrow 23) enters plate 12 via input 21, flows in the direction of arrow 25 (FIG. 2) throughout channel 20, and flows out of plate 12 through output 22 represented by arrow 24. In the example of FIGS. 1 and 2, input 21 includes an input fluid port and output 22 includes an output fluid port. The input fluid port and the output fluid port may be part of a single quick-disconnect connector assembly. However, other types of fluid connectors may be used in place of quick-disconnect assembly.

As explained previously, channel 20 includes sets of islands 28, 29 arranged in series along the fluid flow path. Two sets of serially-arranged islands 28 and 29 are shown in FIG. 2; however, any appropriate number of sets of islands may be included. In this example, each set includes seven islands; however, any appropriate number of islands may be included per set, including a single-island "set". The number of islands per set may be based on the size of plate 12 and the thermal control area. Each set 28, 29 of islands may be separated on channel 20 by one or more non-island features, such a straight or curved conduit.

The sets of islands may be configured and arranged in the channel to distribute fluid and velocity pressure drops across different parts of plate 12. For example, as shown in FIG. 2, across islands 28 and 29, the velocity and thus the energy of the fluid passing through plate 12 decreases, causing fluid pressure drops. These drops in fluid pressure can reduce cavitation in the fluid and, consequently, the vibrations that occur in a device board in contact with plate as a result of collapsing vapor bubbles. In some implementations, sets of islands may be distributed evenly across plate 12 so as to distribute the pressure drops evenly. In an example, an even distribution includes a predefined pressure drop occurring in each same-sized area of the plate. For example, ten equal areas of the plate may each include a pressure drop of 10% such that, at output 22 the pressure of the fluid is zero.

Figure 3:
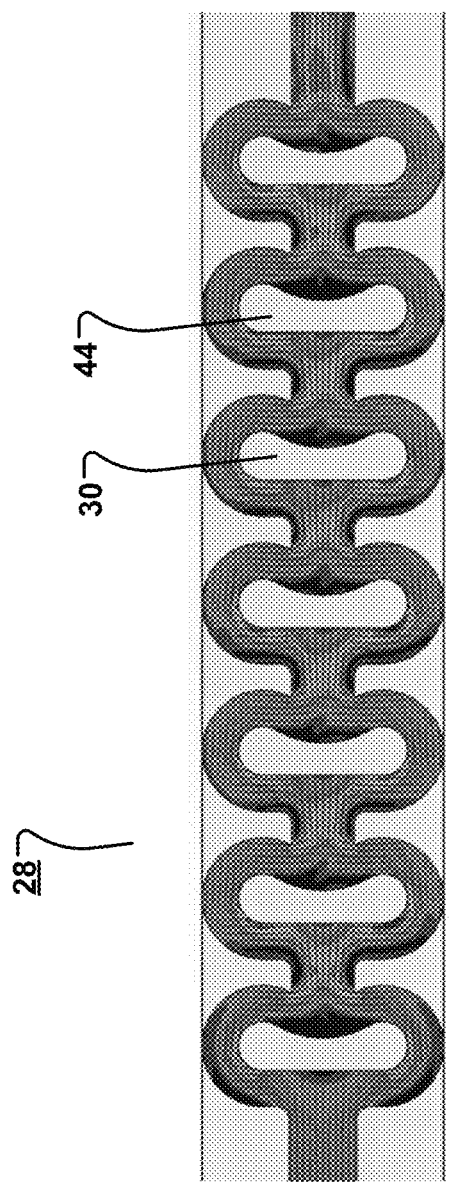
FIG. 3 is a front view of an example set of islands that may be included in the fluid channel of FIG. 2.
Figure 4:
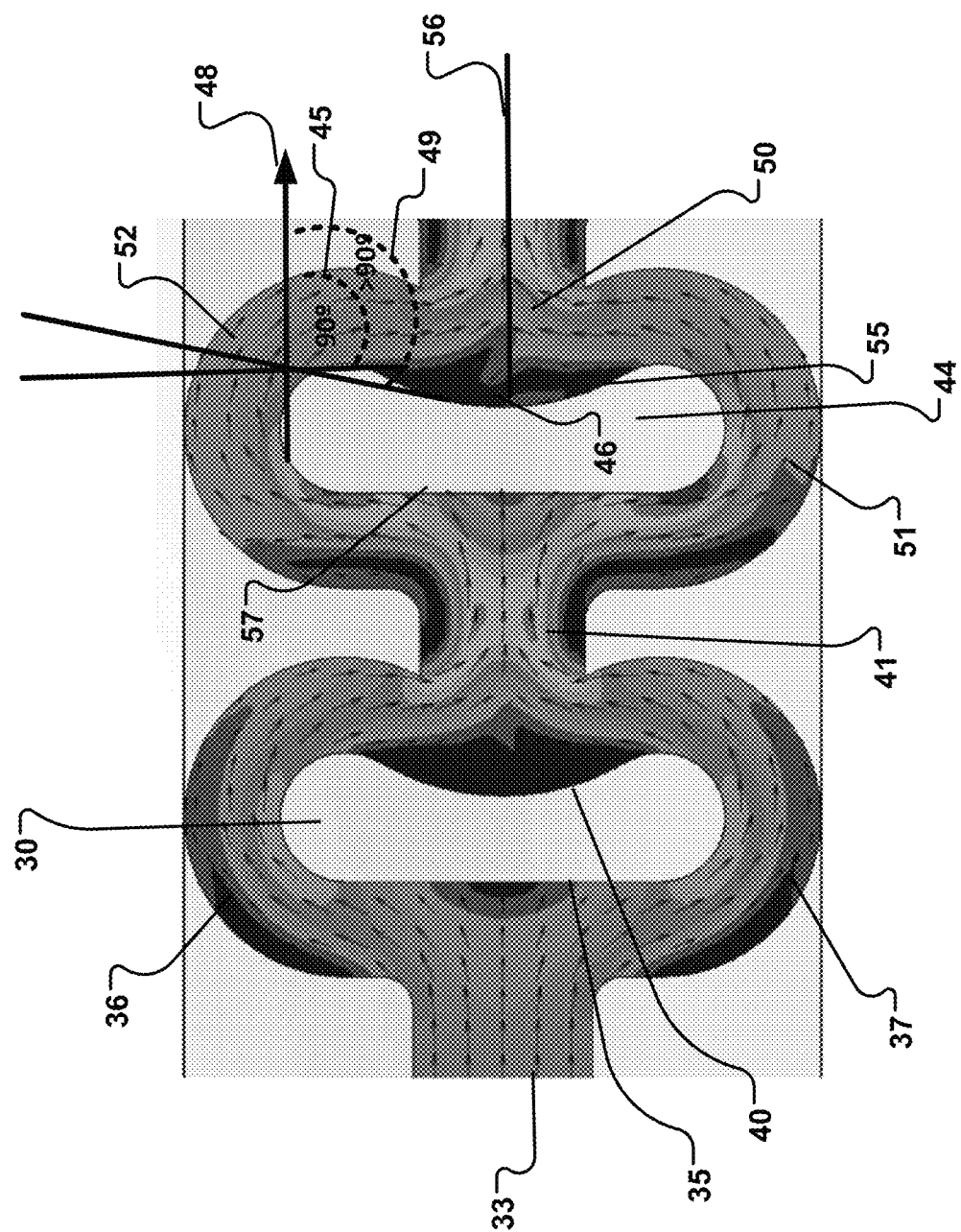
FIG. 4 is a magnified front view of two example islands from the set of FIG. 3.

Referring to FIGS. 3 and 4, in some implementations, each island, such as island 30 in island set 28, is configured and arranged to receive a fluid flow 33 at an upstream side 35 thereof, to split the fluid flow 33 into two flows—a first flow 36 and a second flow 37, and to cause the first flow and the second low to collide and to merge or combine at a point proximate to the downstream (second) side 40 of the island 30. The collision of flows 36 and 37 reduces flow velocity and energy which reduces pressure, as described herein. Following the collision and merging, the merged flow 41 proceeds to the next island 44 or, if the current island is the last in a series or set, along the channel on a path to the output 22. This may or may not include passing through one or more additional sets of islands.

To promote the collision of two flows, such as flows 36 and 37, the islands are designed to have specific shapes. In the examples of FIGS. 2 to 4, each island, such as island 30, is configured in the same shape, in which a downstream side 40 of island 30 is bent and bends each of first flow 36 and second flow 37 past 90° towards a center of the downstream side 40. This is also illustrated with respect to island 44 of FIG. 4. More specifically, in some examples, the angle 49 between the initial flow direction 48 and the center 46 of the downstream side 46 of island 44 is greater than 90° (angle 45). The flow of fluid 52 may likewise bend greater than 90° relative to the initial flow direction 48 in order to promote flow collision between two flows 51 and 52 at downstream side 50. In this regard, in some cases, when flows bend at 90° or less, there may be some collision between the flows, but the resulting collision may not produce the velocity and pressure drops that are produced when angle 49 is greater than 90°. As a result, reductions in cavitation and vibration produced when flows proceed at angle 45 of 90° or less may be less—in some cases considerably less—than when bending angle 49 is greater than 90°. In some cases, when flows proceed at angle 45 of 90° or less, there may be little or no collision between flows downstream 50 of the island. Instead, those flows may proceed onward, in some cases at increased velocity, which may actually contribute to cavitation and the attendant vibrations described herein.

Accordingly, as noted, downstream side 55 of an island such as island 44 is configured to cause separated first 51 and second 52 flows to collide downstream 50 of the island. As noted, collision may be at or near—for example, within a 10% or 20% deviation from—a line 56 perpendicular to center 46 of the downstream side. To achieve collision of flows on the downstream side at an angle 49 that is greater than 90°, each island may have a shape that is at least partly concave. For example, the downstream side 55 bows or curves at its center inward toward the upstream side 57. The curvature may be symmetric in that the curvature to which each flow 51, 52 is subjected may be the same. Thus, the downstream side 55 of island 44 has a shape that is at least partly and symmetrically curved inward towards the upstream side 57. Stated another way, each island such as island 44 is configured to split its input flow of fluid into separate fluid flows 51, 52 and is configured to cause the separate fluid flows 51, 52 to merge downstream. Each of the islands may be concavely curved on the downstream side toward the upstream side in order to bend each of the separate flows 51, 52 past 90° towards the island's center such that the angle between the initial fluid flow direction 48 and the bent fluid flow or island downstream center 46 is greater than 90°.

In some implementations, each island has a shape that approximates the shape of a kidney. In some implementations, each island has a shape that approximates the shape of a jelly bean. Other appropriately concave shapes may also be used. The islands on a single plate may all have the same size or the islands may have different sizes. For example, larger islands may reduce fluid velocity, pressure, and energy greater than smaller islands. The islands on a plate may all have the same shape or the islands may have different shapes. For example, islands having angles 49 that are much greater than 90°—for example, islands that have greater or more pronounced concavity—may reduce fluid velocity and pressure greater than islands having angles 49 that are closer to 90°—for example, islands that have less concavity. Furthermore the islands in a set may all have the same size or the islands may have different sizes, and the islands in a set may all have the same shape or the islands may have different shapes.

As shown in FIG. 2, sets of islands 28, 29 have non-island features separating adjacent islands in a fluid flow path. The non-island features may include, for example, straight-line channel or conduits to connect the islands in a set and to connect a set of islands to the greater channel.

Fluid coolant running through channel 20 in order to cool electronics may be any appropriate cold liquid—for example, water or other liquid that is near but above 0° Celsius (C) may be used. In some examples, cryogenic liquids may be used, such as liquid nitrogen. Fluid through channel 20 in order to heat electronics may be any appropriate warm liquid—for example, water or other liquid that below or near 100° C. may be used, depending upon the amount of heating desired.

Figure 5:
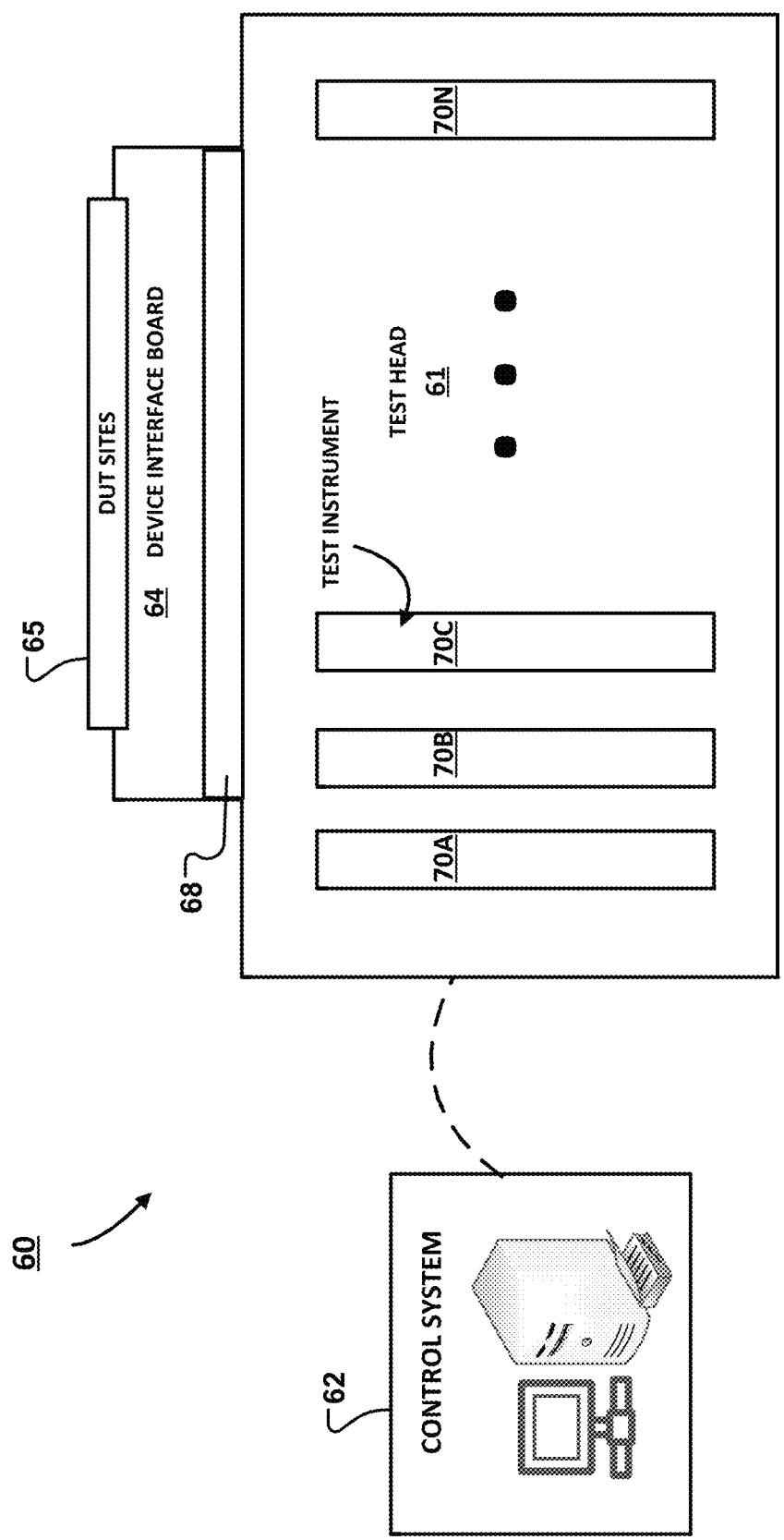
FIG. 5 is a block diagram of an example test system that may include a thermally-conductive plate like that of FIG. 1.

FIG. 5 shows components of ATE 60 that may include a PCB that holds electronics to be cooled or, in some cases heated, before, during, or after testing. The PCB here is a device interface board (DIB), an example of which is described below. ATE 50 may be part of test system. In FIG. 5, the dashed lines represent, conceptually, potential signal paths between components of the test system.

ATE 60 includes a test head 61 and a control system 62. The control system may include a computing system that includes one or more microprocessors or other appropriate processing devices as described herein.

DIB 64 is a device board that is connected to test head 61 directly or indirectly and that includes mechanical and electrical interfaces to one or more devices under test (DUTs) that are being tested or are to be tested by the ATE. The DIB includes sites 65, which may include pins, ball grid arrays (BGAs), conductive traces, or other points of electrical and mechanical connection to which the DUTs may connect. Test signals, response signals, voltage signals, and other signals pass through test channels over the sites between the DUTs and test instruments. DIB 64 may also include, among other things, connectors, conductive traces, and other electronic circuitry for routing signals between the test instruments, DUTs connected to sites 65, and other circuitry. The DUTs and the other circuitry residing on the DIB may be thermally controlled using a thermal plate of the type described herein.

In an example, plate 68 having features such as those described with respect to FIGS. 1 to 4 may be located underneath DIB 64, as shown. Flow of coolant into and out of the channel(s) of plate 68 may be controlled to cool the electronics, including DUTs on the DIB. Temperature control may be part of the testing performed by 60. For example, DUTs may be tested at different temperatures as part of a test protocol. In some implementations, plate 68 is used to maintain the temperature of the DUTs during testing, for example, to draw excess heat from the DUTs during testing so that the DUTs do not overheat.

Control system 62 communicates with components of the test head to control testing. For example, control system 62 may download test program sets to test instruments 70A to 70N in the test head. The test instruments include hardware devices that may include one or more processing devices and other circuitry. Test instruments 70A to 70N may run the test program sets to test DUTs in communication with the test instruments. Control system 62 may also send, to test instruments in the test head, instructions, test data, and/or other information that are usable by the test instruments to perform appropriate tests on DUTs interfaced to the DIB. The tests may be under different temperature conditions. In some implementations, this information may be sent via a computer or other type of network or via a direct electrical path. In some implementations, this information may be sent via a local area network (LAN) or a wide area network (WAN).

A test program generates a test flow (a set of instructions) to provide to the DUT. The test flow is written to output signals to elicit a response from the DUT, for example. The test flow may be written to output signals including radio frequency (RF) or other wireless signals, to receive responses to those signals from the DUTs, and to analyze the response to determine if a device passed or failed testing.

Control system 62 is also configured to control the flow of fluid through plate 68 in order to control the temperature of the DUTs in accordance with a test program or to maintain their temperature as well as the temperature of other electronics on the DIB. One or more valves (not shown) and pumps (not shown) may be controlled by the control system to force fluid through channels such as channel 20 of FIG. 2 and thereby control the temperature of DIB 65 and the electronics thereon including, but not limited to, DUTs. In some implementations, the control may be adaptive. For example, temperature sensors (not shown) on the DIB detect temperatures and send that information back to control system 62 (e.g., wirelessly). In response, control system 62 may control the fluid through plate 68 accordingly. For example, if the DIB is heating considerably, additional cold liquid or a different type of cold liquid may be moved through plate 68 to reduce the temperature of the DIB. Likewise, if the temperature of the DIB is remaining constant, the current fluid flow through plate 68 may be maintained until a change is desired.

As noted, ATE 60 of FIG. 5 includes multiple test instruments 70A to 70N, each of which may be configured, as appropriate, to perform one or more of testing and/or other functions. Although only four test instruments are depicted, the system may include any appropriate number of test instruments, including those residing outside of test head 61. In some implementations, one or more test instruments may be configured to output microwave, RF, or millimeter wave signals to test a DUT based, e.g., on data provided by the control system, and to receive response signals from the DUT. Different test instruments may be configured to perform different types of tests and/or be configured to test different DUTs. The received signals may include response signals that are based on the test signals and/or signals that originate from the DUT that are not prompted by (e.g., are not in response to) test signals. In some implementations, there may be coaxial cables and/or other signal transmission lines between the DUT, the DIB, and the test instrument interfaces over which test and response signals are sent.

Signals may be sent to, and received from, the DUT over multiple test channels. Each of these test channels may include one or more signal transmission lines or other wired or wireless transmission media. In some examples, a test channel may be defined by the physical transmission medium or media over which signals are sent from the test instrument to a DUT and over which signals are received from the DUT. In some examples, a test channel may be defined by a range of frequencies over which signals are transmitted over one or more physical transmission media. A test channel may include conductive trace(s) on the DIB.

All or part of the test systems and processes described in this specification and their various modifications may be configured or controlled at least in part by one or more computers such as control system 36 using one or more computer programs tangibly embodied in one or more information carriers, such as in one or more non-transitory machine-readable storage media. A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the voltage source, the test system, and processes described herein can be performed by one or more programmable processors executing one or more computer programs to control all or some of the well formation operations described previously. All or part of the test systems and processes can be configured or controlled by special purpose logic circuitry, such as, an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices;

magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A system comprising:
a test instrument comprising a thermal plate configured to change a temperature of a device under test by flow of fluid through the thermal plate; and
a control system configured to control operation of the test instrument including the flow of fluid through the thermal plate;
wherein the thermal plate comprises a channel within the thermal plate configured to enable the flow of fluid between an input port and an output port, the thermal plate comprising a thermally conductive material to conduct heat between the device under test and the fluid, the channel comprising a first branch and a second branch that diverge, the first branch being configured to carry a first fluid flow comprising a first portion of the flow of fluid and the second branch being configured to carry a second fluid flow comprising a second portion of the flow of fluid, the first portion and the second portion being an entirety of the flow of fluid, the first branch and the second branch being configured to reconnect to thereby form an island among multiple islands in the channel and to merge the first fluid flow and the second fluid flow downstream of a point where the first branch and the second branch diverge, the island having a first side at a point where the first branch and the second branch diverge and a second side at a point where the first channel and the second channel reconnect, the second side having a shape that bows or curves inward at a center of the second side towards the first side.

2. The system of claim 1, wherein the second side of the island is formed to bend each of the first fluid flow and the second fluid flow past 90° towards the center of the second side.

3. The system of claim 1, wherein the second side of the island is formed to cause the first fluid flow and the second fluid flow to collide downstream of the first side of the island.

4. The system of claim 1, wherein the device under test comprises a circuit board, and wherein the fluid comprises a liquid or gaseous coolant to draw heat from the circuit board.

5. The system of claim 1, wherein the test instrument comprises a radio frequency test instrument.

6. The system of claim 1, wherein the channel comprises sets of the multiple islands formed at points along the channel, each set of the multiple islands being separated on the channel; and
wherein the sets of multiple islands are arranged in the channel to distribute fluid pressure drops across different parts of the thermal plate.

7. The system of claim 1, wherein the island has a shape that approximates a shape of a kidney.

8. The system of claim 1, wherein the island has a shape that approximates a shape of a jelly bean.

9. The system of claim 1, wherein the second side of the island has a shape that is at least partly concave.

10. The system of claim 1, wherein each of the multiple islands is arranged to receive the fluid at a first side, and is formed by branches configured to split the flow of fluid into separate fluid flows to cause the separate fluid flows to merge downstream; and
wherein each of the multiple islands is configured to bend each of the separate flows past 90° towards an island center.

11. The system of claim 1, wherein the multiple islands are configured to reduce energy of the flow of fluid through the channel.

12. The system of claim 1, wherein the multiple islands are configured to reduce energy of the flow of fluid through the channel without increasing velocity of the flow of fluid through the channel.

13. The system of claim 1, wherein the first branch and the second branch are configured to cause the first fluid flow and the second fluid flow to collide downstream of the first side of the island and to thereby merge for downstream movement to a second island among the multiple islands.

14. The system of claim 1, further comprising:
a quick disconnect assembly comprising the input port to receive the fluid and the output port to move the fluid off of the thermal plate.

15. The system of claim 1, wherein the fluid comprises heated liquid to increase a temperature of the device.

16. The system of claim 1, further comprising:
a thermally-conductive substance between the thermal plate and the device.

* * * * *